United States Patent
Nelson et al.

(10) Patent No.: US 7,709,050 B2
(45) Date of Patent: May 4, 2010

(54) SURFACE TREATMENT FOR OLED MATERIAL

(75) Inventors: Curtis L. Nelson, Corvallis, OR (US); Ravi Prasad, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1192 days.

(21) Appl. No.: 10/909,951

(22) Filed: Aug. 2, 2004

(65) Prior Publication Data

US 2006/0022586 A1    Feb. 2, 2006

(51) Int. Cl.
*B05D 5/06* (2006.01)
*B05D 3/00* (2006.01)

(52) U.S. Cl. .................. 427/66; 427/554; 427/555; 313/504; 428/917; 445/24

(58) Field of Classification Search .............. 427/66, 427/554, 555; 313/504; 428/917; 445/24
See application file for complete search history.

(56) References Cited

U.S. PATENT DOCUMENTS

| | | | |
|---|---|---|---|
| 4,550,326 A | 10/1985 | Allen et al. | |
| 4,555,062 A | 11/1985 | You | |
| 5,010,356 A | 4/1991 | Albinson | |
| 5,189,437 A | 2/1993 | Michaelis et al. | |
| 5,300,959 A | 4/1994 | McClelland et al. | |
| 5,305,015 A | 4/1994 | Schantz et al. | |
| 5,408,738 A | 4/1995 | Schantz et al. | |
| 5,417,897 A | 5/1995 | Asakawa et al. | |
| 5,434,606 A | 7/1995 | Hindagolla et al. | |
| 5,595,785 A | 1/1997 | Hindagolla et al. | |
| 5,598,193 A | 1/1997 | Halko et al. | |
| 5,633,664 A | 5/1997 | Bayat | |
| 5,748,216 A | 5/1998 | Scheffelin et al. | |
| 6,004,685 A | 12/1999 | Antoniadis et al. | |
| 6,120,131 A | 9/2000 | Murthy et al. | |
| 6,123,413 A | 9/2000 | Agarwal et al. | |
| 6,130,688 A | 10/2000 | Agarwal et al. | |
| 6,254,219 B1 | 7/2001 | Agarwal et al. | |
| 6,268,522 B1 * | 7/2001 | Hagemeyer et al. | 560/245 |
| 6,290,331 B1 | 9/2001 | Agarwal et al. | |
| 6,312,103 B1 | 11/2001 | Haluzak | |
| 6,318,843 B1 | 11/2001 | Feder et al. | |
| 6,331,055 B1 | 12/2001 | Miller et al. | |
| 6,371,596 B1 | 4/2002 | Maze et al. | |
| 6,645,569 B2 | 11/2003 | Cramer et al. | |
| 6,664,027 B2 | 12/2003 | Griffith et al. | |

(Continued)

FOREIGN PATENT DOCUMENTS

EP    0648803 A1    4/1995

(Continued)

OTHER PUBLICATIONS

"Encapsulant Materials for Filing Flip-Chip Attach," L. Gopalakrishnan et al., 1998 IEEE, Electronic Components and Technology Conference (pp. 1291-1297).

(Continued)

*Primary Examiner*—Katherine A Bareford
*Assistant Examiner*—Jimmy Lin

(57) ABSTRACT

A method is disclosed for treating an area on a surface to increase affinity for a fluid including organic light emitting diode (OLED) material.

11 Claims, 4 Drawing Sheets

U.S. PATENT DOCUMENTS

| | | |
|---|---|---|
| 6,699,728 B2 | 3/2004 | Guenther et al. |
| 6,938,986 B2 | 9/2005 | Macler et al. |
| 2001/0022497 A1* | 9/2001 | Aoki et al. .................. 313/507 |
| 2002/0075422 A1* | 6/2002 | Kimura et al. ................ 349/43 |
| 2002/0113241 A1* | 8/2002 | Kubota et al. ................ 257/79 |
| 2003/0072890 A1* | 4/2003 | Miyazawa .................. 427/554 |
| 2003/0108664 A1* | 6/2003 | Kodas et al. ................ 427/125 |
| 2003/0136959 A1* | 7/2003 | Araki .......................... 257/40 |
| 2003/0138663 A1* | 7/2003 | Mori et al. .................. 428/690 |
| 2003/0140982 A1* | 7/2003 | Seki et al. ...................... 141/1 |
| 2003/0143339 A1* | 7/2003 | Kobayashi .................. 427/558 |
| 2003/0230967 A1* | 12/2003 | Kawamura et al. .......... 313/483 |
| 2004/0179146 A1* | 9/2004 | Nilsson ....................... 349/49 |
| 2005/0003567 A1* | 1/2005 | Yasukawa et al. ............. 438/30 |
| 2005/0012197 A1 | 1/2005 | Smith et al. |
| 2005/0062021 A1* | 3/2005 | Petrov et al. ................ 252/500 |
| 2005/0173769 A1 | 8/2005 | Michael et al. |

FOREIGN PATENT DOCUMENTS

| | | |
|---|---|---|
| EP | 0694400 A2 | 1/1996 |
| EP | 0694400 B1 | 1/1996 |
| FR | 2747960 | 10/1997 |
| WO | WO 01/46987 | 6/2001 |

OTHER PUBLICATIONS

Patent Abstracts of Japan, vol. 2000, No. 02, Feb. 29, 2000 & JP 11 310651 A (Hitachi Ltd), Nov. 9, 1999 abstract.

Precision Industrial Ink Jet Printing Technology for Full Color PLED Display Manufacturing, Edwards et al., Litrex Corp. 6670 Owens Drive, Pleasanton, CA 945888; Web: www.Itrex.com printed before filing date.

Precision Industrial Ink Jet Printing Technology for Full Color PLED Display and TFT-LCD Manufacturing, Bennett et al., Litrex Corp, 6670 Owens Drive, Pleasanton, CA 945888; 2003; Web: www.Itrex.com.

* cited by examiner

SURFACE TREATMENT FOR OLED MATERIAL

BACKGROUND

Displays for electronic equipment such as personal computers and digital cameras can make use of organic light emitting diode (OLED) technology. When electrical current is applied to an OLED, a bright light can be emitted, by a process of electroluminescence.

A difficulty in mass-producing displays using OLED technology is depositing the OLED material in the precise locations where the pixels should be located.

BRIEF DESCRIPTION OF THE DRAWINGS

Features and advantages of the disclosure will readily be appreciated by persons skilled in the art from the following detailed description when read in conjunction with the drawing wherein.

DETAILED DESCRIPTION

Figure 1:
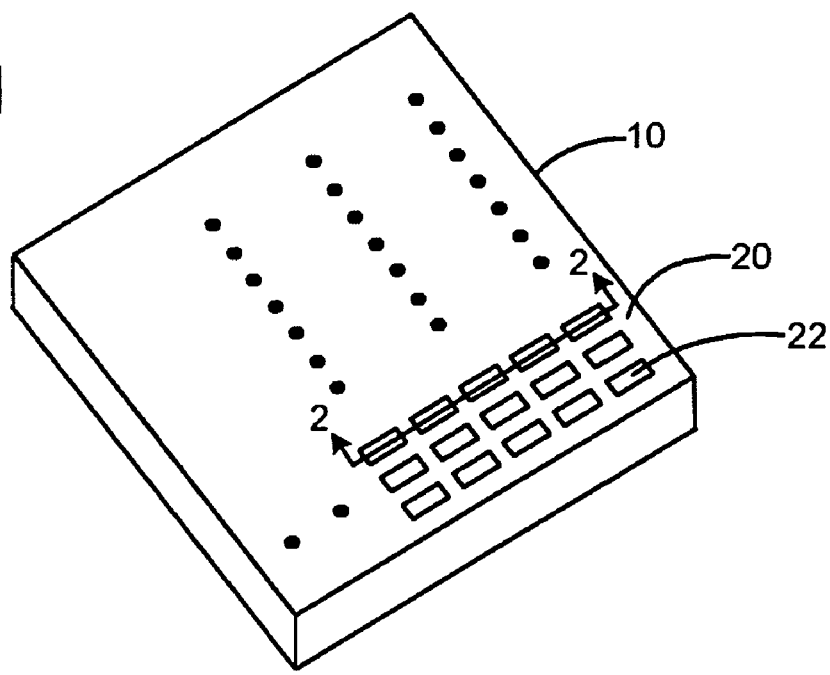
FIG. 1 illustrates an exemplary display substrate 10 with a desired pixel pattern shown thereon.

In the following detailed description and in the several figures of the drawing, like elements are identified with like reference numerals.

In an exemplary embodiment, a laser pre-treatment is used to prepare a display substrate to control the OLED deposition and precisely locate the display pixels. The laser-pretreatment changes the wettability of the substrate, such that the OLED material is positioned on the desired pixel locations. An exemplary OLED material is Poly Phenylene Vinylene (PPV). OLED material is organic semiconductor material, and more particularly organic light emitting diode material. PLED material is a type of OLED material, formed of long chain or polymer organic LED material.

FIG. 1 illustrates an exemplary display substrate 10 with a desired pixel pattern 20 shown on a substrate surface 12, comprising a pixel array of spaced pixel locations 22. In one exemplary embodiment, the pixel locations 20 are 0.2 mm by 0.15 mm, and are spaced apart by 0.05 mm (in each row), and 0.05 mm (in each column). An exemplary substrate material is glass.

Figure 2:
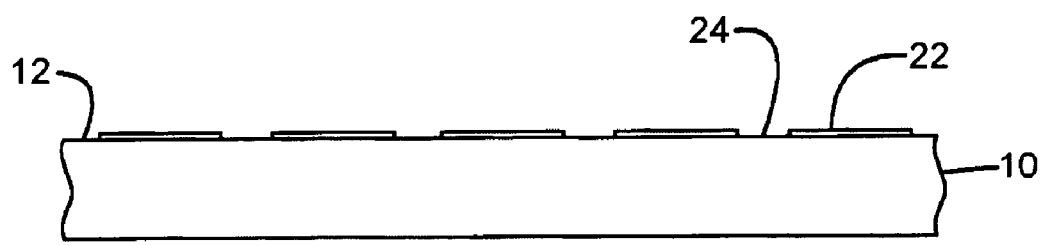
FIG. 2 is a diagrammatic cross-sectional view taken along line 2-2 of FIG. 1.

FIG. 2 diagrammatically depicts the surface 12 of the substrate 10, with the pixel locations 22. In one embodiment, the surface is treated by a surface treatment to define the pixel locations, e.g. by a laser treatment. The surface treatment increases the affinity of the surface regions of the pixel locations 22 to a fluid containing an OLED material to be deposited on the substrate surface during a display fabrication step. In another embodiment, the regions 24 of the surface 12 adjacent the pixel locations 22 have a surface characteristic which repels the fluid containing the OLED material, tending to confine the fluid to the pixel locations. The surface of the substrate may be non-wetting to the fluid. The regions 24 may also optionally be surface treated to decrease the affinity of the surface regions 24 to the fluid.

Figure 3:
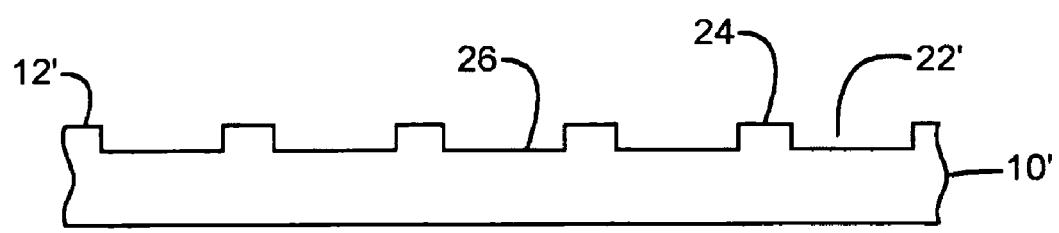
FIG. 3 is a diagrammatic cross sectional view of an alternate embodiment of an exemplary display substrate.

FIG. 3 diagrammatically depicts an alternate embodiment of a display substrate 10', wherein the pixel locations 22' comprise wells 26 formed in the substrate surface, e.g. to a depth of 50 microns. In an exemplary embodiment, the wells may be formed by photolithographic techniques. The surface treatment techniques, e.g. laser surface treatment, may also be a suitable means for ablation of a photoresist patterned for defining the wells, and as well change the surface property of a substrate, e.g. glass. The surfaces 22' at the bottom of the wells are surface treated to increase affinity for the fluid containing the OLED material. The treatment can be performed by a laser treatment. As with the embodiment of FIG. 2, the surface regions 24 adjacent the pixel locations 22' may optionally be treated to decrease affinity for the fluid containing the OLED materials.

Figure 4:
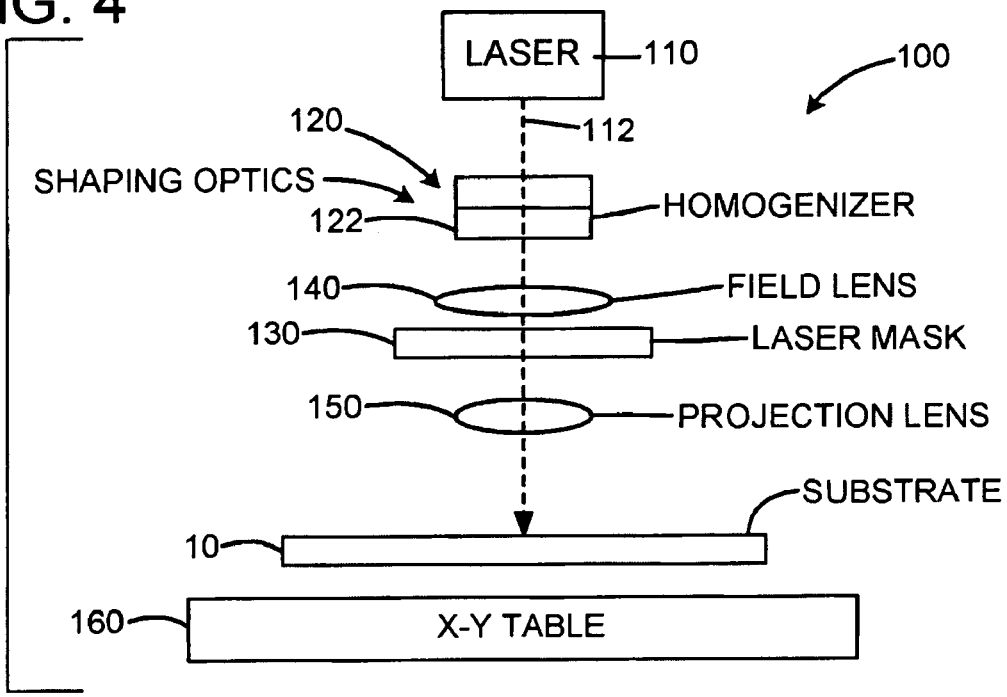
FIG. 4 schematically illustrates an exemplary embodiment of a laser ablation system for surface treating the surface of an exemplary substrate.

FIG. 4 schematically illustrates an exemplary embodiment of a laser treatment system 100 for surface treating the surface of a substrate, e.g. substrate 10 or 10'. In some applications, the laser treatment system may remove substrate material, i.e. ablate the surface. In other cases, the laser treatment system may not remove substrate material from the surface; e.g. in some cases the laser system may just be removing contaminants on the surface, i.e. a sort-of cleaning step, or oxidizing the substrate material. A laser 110 generates a laser beam 112; in one exemplary embodiment, the laser is a pulsed excimer laser operating at a wavelength of 248 nm. The beam 112 is passed through shaping optics 120 which includes a homogenizer 122. In this exemplary system, the shaping optics 120 includes a set of lenses that collimate the laser light and expand the size and shape of the laser beam to what is suitable for the particular application. The homogenizer 122 includes optical elements that make the intensity profile of the laser beam uniform. The beam is passed through the field lens 140, then through the laser mask 130. The image is then reduced in size by a projection lens 150 which also focuses the mask pattern onto the substrate 10. The pattern before the projection lens is larger than the patter that will be formed on the substrate. An exemplary projection lens may have a 1-10× reduction in magnification, and focuses the beam to the desired pattern size. The substrate 10 can be mounted on an X-Y table for moving the substrate.

Figure 5:
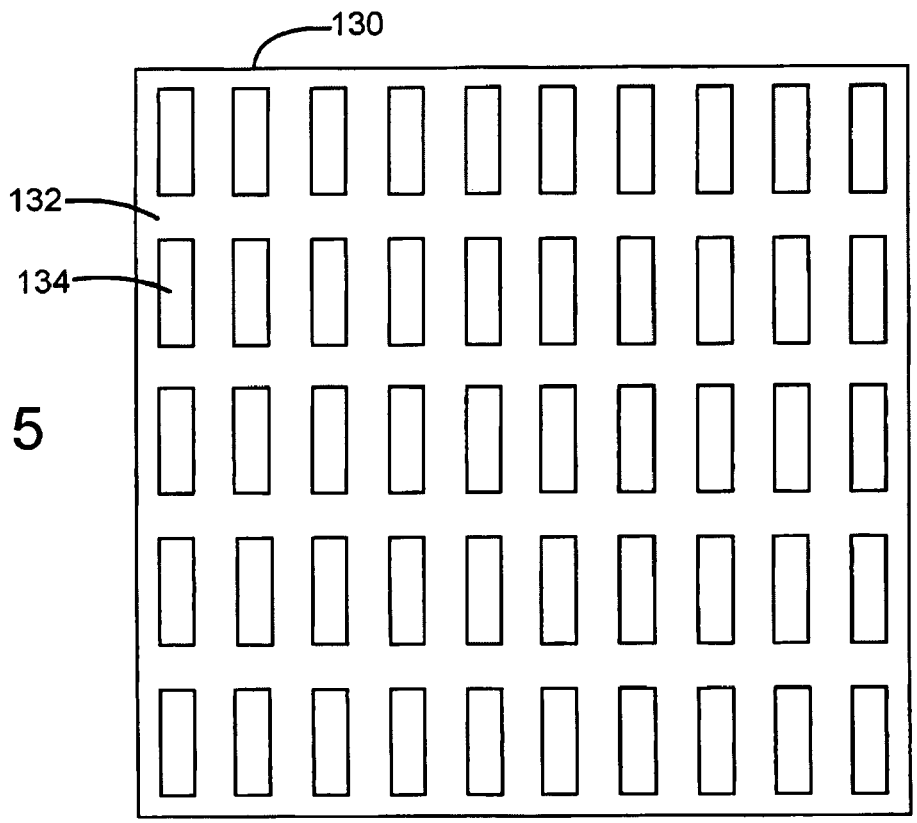
FIG. 5 diagrammatically depicts an exemplary embodiment of a mask for laser treating an embodiment of a pixel pattern using the system of FIG. 4.

An exemplary embodiment of a laser mask 130 is depicted in FIG. 5, and is designed to pattern certain areas on the substrate 10. The mask is fabricated of an opaque material 132, with optically transparent regions 134 formed therein which, in one embodiment, correspond to the pixel regions to be formed on the substrate surface. The laser parameters for the surface treatment may differ depending on which substrates and which fluids are being used. An example is a substrate of indium tin oxide (ITO)-on-glass and a liquid solution using toluene as the solvent. Under those conditions, a contact angle decrease of 65 degrees has been measured using a laser fluence of 200 mJ/cm2 and a shot count range of 1-100 shots.

Figure 6:
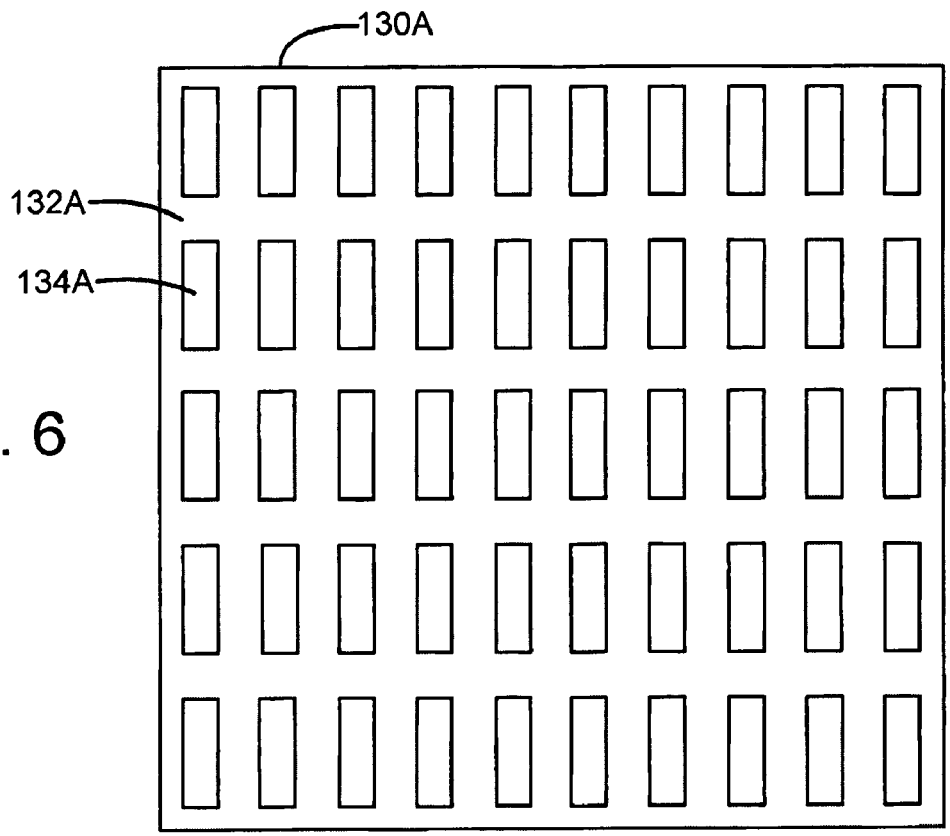
FIG. 6 depicts an exemplary embodiment of a complementary mask for surface treating areas adjacent pixel locations using the system of FIG. 4.

The laser system of FIG. 4 can also be used to surface treat the regions of the substrate adjacent the pixel regions to decrease the affinity of the adjacent regions to the fluid containing the OLED material. In an exemplary embodiment, a mask with optically transparent regions in a complementary fashion relative to the transparent regions 134 of mask 130 may be employed. FIG. 6 shows a complementary mask 130A, with optically transparent regions 132A and opaque regions 134A.

Once the substrate surface has been treated, a fluid containing the OLED material may be dispensed onto the surface. One exemplary fluid is toluene; an exemplary OLED material is poly phenyl vinylene (PPV). Other exemplary fluids include Xylene and Dimethylformamide (DMF). Other exemplary OLED materials include polyfluorenes. One exemplary technique for dispensing the fluid is to use a fluid drop emitter, e.g. an "inkjet" printhead such as a thermal inkjet printhead or a piezoelectric printhead. The fluid drop emitter can be carried by a carriage for movement along a single axis or dual axes, or fixed in position and the substrate moved in two dimensions relative to the fixed emitter. Thus, control of the drop emitter to time and place the drop emission can be accomplished.

Figure 7:
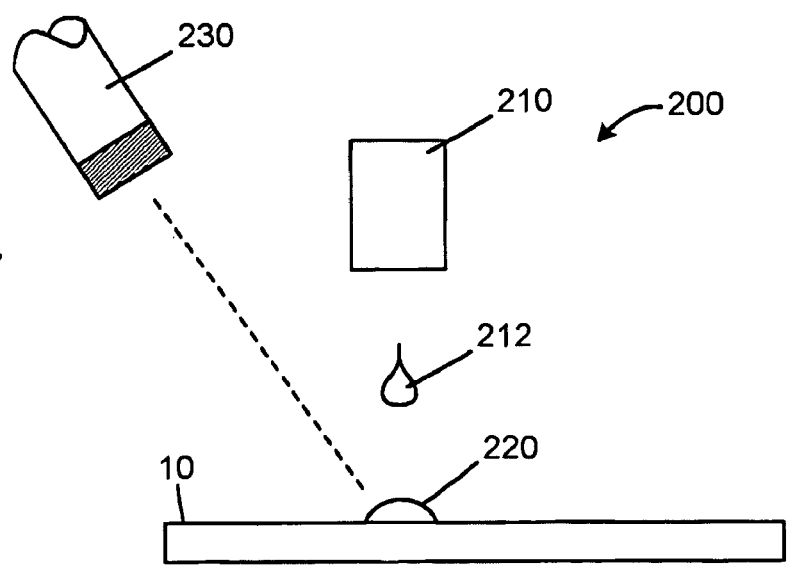
FIG. 7 is a schematic block diagram of an exemplary embodiment of a system for depositing a fluid with OLED material onto the substrate.

FIG. 7 is a schematic block diagram of an exemplary embodiment of a system 200 for depositing the OLED fluid onto the surface of substrate 10. FIG. 7 diagrammatically depicts an exemplary quantity of fluid 220 carrying the OLED material after being jetted onto the substrate surface. The system of FIG. 7 employs a fluid jetting device 210 which is controlled to emit drops 212 of fluid containing the nanoparticles. This device may include a thermal or piezoelectric inkjet printhead, a spray head, a needle dispenser or a pipette. The system 200 in an exemplary embodiment includes a locator system for the substrate, i.e. an X, Y, Z locator. The device 210 may include a scanning carriage for moving the print carriage relative to the surface. A locating/fluid drop landing system 230, e.g. a camera system, can be employed to optically sense the location of the jetted drops onto the substrate. The sensed information can be used to control the jetting device and an X-Y positioning system which provides relative positioning movement between the substrate and the jetting device. This can be a closed loop feedback system to accurately control the jetting device and the location of the jetted drops on the substrate.

Another exemplary technique for dispensing the OLED material is a spin-coating deposition technique. In an exemplary spin-coating technique, the substrate is attached to a spinner using a vacuum or an adhesive base. Then a prescribed amount of OLED material suspended in a solvent is dispensed onto the surface. The base spins the substrate up to a prescribed rotational velocity and then maintains that rotational velocity for a prescribed amount of time. The angular rotation causes the OLED material to remain in place on the treated pixel areas after the spinning and it is spun off of the non-treated areas.

After the fluid containing the OLED has been dispensed onto the surface of the substrate, the substrate is processed further to remove the fluid solvent. This processing may include a drying process. The drying step may be a controlled evaporation in an inert atmosphere of dry nitrogen since the OLED materials may be moisture and oxygen sensitive.

An exemplary embodiment of a display substrate for an OLED display is an ITO-on-glass substrate. In this example, an ITO layer having a thickness of 50 nm to 200 nm is formed on a glass substrate. An exemplary carrier fluid is toluene. This substrate is quite non-wetting for toluene, in the absence of surface treatment. The substrate can be made to have substantially enhanced wetting to toluene by laser treatment. Thus, the spread of toluene carrying the OLED material can be controlled, by selectively surface treating the pixel locations, i.e. the areas where it is desired for the toluene to flow, and not treating areas where the toluene is not wanted. After a surface treatment, the ITO layer can still carry current to the OLED material so that it can be turned on. The wettability of the ITO is changed, by a surface treatment which removes organic contaminants and changes the surface roughness.

Another exemplary embodiment of a display substrate is ITO-on-plastic, e.g. PEN (polyethylene naphthalate). This substrate has a layer of ITO on the top surface of the plastic substrate. Tests have demonstrated that the ITO-on-plastic substrate is quite wetting for toluene. The reason for this is not fully understood, but may be that the deposited ITO follows the uneven surface of the plastic and therefore presents more surface area to the toluene and causes the toluene to wet on the surface. By laser ablating through the ITO layer to the plastic layer in areas in which the toluene is not desired, the substrate can be patterned to control flow of toluene in which OLED particles are suspended to the pixel locations, i.e., those areas which are not surface treated.

Figure 8:
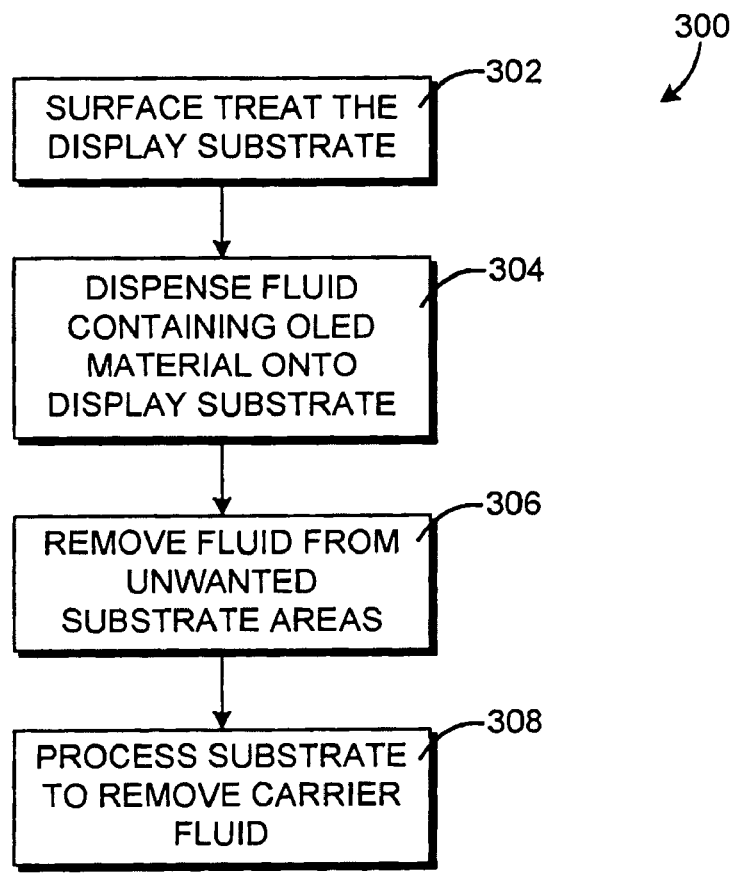
FIG. 8 is a flow diagram of an exemplary process for fabrication of OLED display substrates.

FIG. 8 is a flow diagram of an exemplary process 300 for fabrication of OLED display substrates. The display substrate is surface treated at step 300, e.g. to increase the affinity of the pixel locations for the fluid containing the OLED material and optionally to decrease the affinity of surface areas surrounding the pixel locations for the fluid. At step 304, the fluid containing an OLED material is dispensed onto the substrate surface, e.g. by jetting, spin-coating or by pipette. At optional step 306, fluid may be removed from areas of the substrate which are to be free of the liquid and OLED material. At 308, the substrate is processed to remove the carrier fluid, leaving behind the OLED material at the pixel locations.

Figure 9:
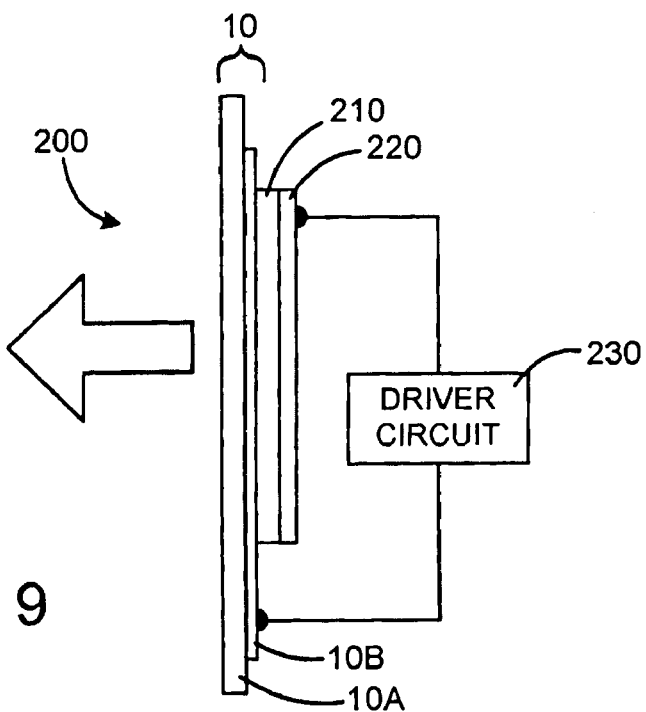
FIG. 9 is a diagrammatic side view of an exemplary embodiment of an OLED display.

FIG. 9 is a simplified schematic side view of an OLED display system 200. The system includes a transparent substrate structure 10, which may comprise a glass substrate 10A with an ITO coating layer 10B. The layer 10B is surface treated as described above to have a pixel pattern of surface regions which have an increased affinity for the fluid containing the OLED material. Layer 210 represents a patterned OLED layer, which remains after processing the substrate structure to remove the fluid carrier. The OLED material in layer 210 is in the pixel locations, e.g., as illustrated for the embodiment of FIG. 1. A cathode layer 220 is formed over the OLED layer. The cathode layer can be a metallic electrode with a low work function, e.g. calcium. A driver circuit 230 is electrically connected between the ITO layer, which functions as the anode, and the cathode layer 220. Upon energization by the driver circuit 230, which selectively applies a voltage and hence an electric field between the anode and cathode, the pixel locations emit light which passes through the transparent substrate layer as shown by the arrow in FIG. 9.

Although the foregoing has been a description and illustration of specific embodiments of the invention, various modifications and changes thereto can be made by persons skilled in the art without departing from the scope and spirit of the subject matter defined by the following claims.

What is claimed is:

1. A method for forming a display, comprising:
providing an indium tin oxide (ITO) layer on a glass substrate;
forming a plurality of pixel locations in the glass substrate;

treating a well area of the pixel locations on the glass substrate using a laser beam to increase affinity for a fluid comprising organic light emitting diode (OLED) material;

forming an area on the glass substrate using the laser beam to decrease affinity of the glass substrate to the fluid comprising the OLED material in periphery areas where no dispensing of the fluid occurs in which affinity to the fluid is not desired;

using a first laser mask for treating areas to increase affinity;

using a second laser mask for treating areas to decrease affinity; and dispensing said fluid onto the treated surface of the ITO layer such that the OLED material is positioned at the treated areas.

2. The method of claim 1, wherein said dispensing the fluid comprises:

ejecting drops of the fluid from a fluid drop generator.

3. The method of claim 1, further comprising:

after dispensing the fluid, removing the fluid from unwanted regions of the surface of the ITO layer.

4. The method of claim 3, wherein said removing the fluid comprises spinning the surface.

5. The method of claim 1, wherein said dispensing the fluid comprises coating the treated surface with a layer of the fluid and spinning the surface.

6. The method of claim 1 wherein said fluid comprises one of toluene, Xylene and Dimethylformamide.

7. The method of claim 1 wherein said OLED material comprises one of Poly Phenylene Vinylene (PPV) and a polyfluorene.

8. A method for forming a display comprising:

forming a plurality of wells defining pixel locations in a glass substrate;

treating the surfaces of the wells using a laser beam to increase affinity for a fluid comprising organic light emitting diode (OLED) material;

forming an area on the glass substrate using the laser beam to decrease affinity of the glass substrate to the fluid comprising the OLED material in periphery areas where no dispensing of the fluid occurs in which affinity to the fluid is not desired;

using a first laser mask for treating areas to increase affinity;

using a second laser mask for treating areas to decrease affinity; and dispensing said fluid into the wells.

9. The method of claim 8, wherein said dispensing the fluid comprises ejecting drops of the fluid from a fluid drop generator.

10. The method of claim 8, wherein said fluid comprises one of toluene, Xylene and Dimethylformamide.

11. The method of claim 8, wherein said OLED material comprises one of Poly Phenylene Vinylene (PPV) and a polyfluorene.

* * * * *